United States Patent [19]
Kuniyoshi et al.

[11] 4,006,423
[45] Feb. 1, 1977

[54] PHASE DETECTOR

[75] Inventors: Yasunobu Kuniyoshi; Kazuo Yamagiwa, both of Tokyo, Japan

[73] Assignee: Sony Corporation, Tokyo, Japan

[22] Filed: Apr. 17, 1975

[21] Appl. No.: 568,782

[30] Foreign Application Priority Data

Apr. 25, 1974 Japan .............................. 49-46942

[52] U.S. Cl. .............................. 329/103; 307/295; 307/232
[51] Int. Cl.² .......................................... H03K 5/20
[58] Field of Search ............... 307/232, 295; 331/8, 331/27; 329/103, 110; 178/69.5 CB

[56] References Cited

UNITED STATES PATENTS

| | | | |
|---|---|---|---|
| 3,651,418 | 3/1972 | Wittmann | 307/232 |
| 3,854,098 | 12/1974 | Takahashi | 307/232 |
| 3,857,110 | 12/1974 | Grebene | 331/8 |
| 3,863,080 | 1/1975 | Steckler | 307/232 |
| 3,869,679 | 3/1975 | Grebene | 331/8 |

*Primary Examiner*—John Kominski
*Attorney, Agent, or Firm*—Lewis H. Eslinger; Alvin Sinderbrand

[57] ABSTRACT

A phase detector comprising a first differential amplifier for receiving a first input signal and having an output circuit which produces an output that is a direct function of the first input signal. An actuable second differential amplifier receives a second input signal and includes an output circuit for producing an output signal which is proportional to the phase difference between the first and second input signals. The second differential amplifier is coupled to the first differential amplifier output circuit so as to be actuated by the output produced by the output circuit and to thereby produce an output signal representing the phase difference between the second input signal and the output supplied by the first differential amplifier output circuit. The output produced by the first differential amplifier output circuit is supplied as a differential amplifier current to the second differential amplifier. Hence, in one embodiment, the second differential amplifier includes common-connected stages connected in differential configuration, the common connection being coupled to the first differential amplifier output circuit.

9 Claims, 4 Drawing Figures

PHASE DETECTOR

BACKGROUND OF THE INVENTION

This invention relates to an improved phase detector and, more particularly, to a phase detector which can readily be used to detect the phase of an input signal which is received during recurrent, or periodic, intervals.

Various types of phase detecting circuits are known for producing an output signal representing the phase difference between respective input signals. Such phase detectors are used in diverse applications, such as in detecting, or demodulating, information which has been phase-modulated onto a carrier; and in servo-controlled or feedback systems wherein the phase of one signal is to be controlled in accordance with the phase of another signal.

In general, of the various types of phase detectors which can be used in such applications, it is preferable, in many instances, to use a balanced-type of phase detector circuit. Typically, such balanced-types of phase detectors include the so-called single- and double-balanced types. The single-balanced type detector which has heretofore been used offers the advantage of a relatively simple circuit configuration. However, such single-balanced type phase detector exhibits relatively low sensitivity. That is, even in the absence of an input signal, the phase detector produces an output voltage. More particularly, an output voltage $e$ is derived as a result of various bias currents and voltages, even when no input signals are applied. However, when an input signal having zero phase difference with respect to a reference signal is present, the voltage output of this single-balanced type of phase detector is reduced to zero. If a phase difference of, for example, 90° is present, the output of the phase detector may, for example, rise to the voltage $e$. If the phase differential of the input signal increases to 180°, the phase detector output voltage may further rise to a level $2e$. Since the voltage $e$ is produced even in the absence of an input signal, it is apparent that the sensitivity of this single-balanced type of phase detector varies from $e$ to zero and from $e$ to $2e$. Thus, if the sensitivity of the detector is considered to be from zero to $2e$, the effective sensitivity of this single-balanced type of phase detector is seen to be only one-half of the full sensitivity.

As a further defect of the typical single-balanced type of phase detector circuit, if the circuit is used to detect the phase of a signal which is applied during periodic, or intermittent, time intervals, the presence of a noise signal at a time which is adjacent such time intervals will appear in the detector output. Similarly, noise which is superposed during such intermittent time intervals also will appear in the detector output.

As a still further disadvantage of typical single-balanced type of phase detectors, variations in the magnitude of the signal whose phase is to be detected causes corresponding variations in the detector output voltage. This has the result of varying the effective sensitivity of the phase detector.

Some of the problems attending the use of single-balanced type phase detectors can be overcome by using the so-called double-balanced type of phase detector. In particular, the problem of half sensitivity of the single-balanced type detector caused by the presence of an output voltage even in the absence of an input signal, is not found in the double-balanced type of detector. That is, the full sensitivity can be attained by the double-balanced type because no output voltage is provided in the absence of an input signal. However, this advantage is obtained at the cost of complex circuit configuration requiring the use of a large number of circuit elements. Hence, the double-balanced type of phase detector is seen to be a relatively expensive circuit.

Also, even though the sensitivity of the double-balanced type of detector can be improved over that of the single-balanced type, the aforenoted problem with respect to the influence of input noise on the detector output is not easily avoided. Furthermore, even in the double-balanced type of detector, variations in the effective detector sensitivity are caused by input signal amplitude changes. Thus, the output voltage of both the single- and double-balanced type of detector is increased if the input signal amplitude is high, whereas the output voltage is decreased if the input signal amplitude is low. Thus, if output voltage is to be used as a measure of the input phase differential, it is possible that fluctuations in the input signal amplitude will result in erroneous phase detections.

OBJECTS OF THE INVENTION

Therefore, it is an object of the present invention to provide an improved single-balanced type of phase detector which exhibits full sensitivity.

Another object of this invention is to provide an improved phase detector having high signal sensitivity but which is relatively insensitive to input noise.

Yet another object of this invention is to provide an improved phase detector which can be readily used to detect the phase of an input signal which is supplied during periodic, or intermittent, time intervals.

A further object of this invention is to provide an improved phase detector whose effective sensitivity is not influenced by input signal amplitude fluctuations.

An additional object of this invention is to provide an improved phase detector for detecting the phase of an input signal applied during intermittent time intervals and which is relatively insensitive to input noise which is present during, or adjacent, such intermittent intervals.

Still another object of this invention is to provide an improved phase detector formed of relatively simple circuit configuration which finds ready application as a phase detector for use in the color control circuit of a color television receiver to detect the phase differential of an input burst signal.

Various other objects and advantages of this invention will become apparent from the forthcoming detailed description and the novel features will be particularly pointed out in the appended claims.

SUMMARY OF THE INVENTION

In accordance with this invention, a phase detector is provided comprised of a first differential amplifier for receiving a first input signal and having an output circuit for producing an output which is a direct function of the first input signal, and an actuable second differential amplifier for receiving a second input signal and actuated by the output produced by the first differential amplifier output circuit to thereby be conditioned to produce an output signal, the output signal produced by the second differential amplifier represents the phase difference between the first and second input signals. In one embodiment, the first differential amplifier output circuit comprises a further differential amplifier formed of differentially connected stages, and one of such stages is coupled to the second differential amplifier for supplying a differential amplifier current thereto. Thus, when the one stage of the further differential amplifier is conductive, the second differential amplifier is conditioned to produce a phase detector output signal.

BRIEF DESCRIPTION OF THE DRAWINGS

The following detailed description of certain ones of the preferred embodiments will best be understood in conjunction with the accompanying drawing in which.

DETAILED DESCRIPTION OF CERTAIN ONES OF THE PREFERRED EMBODIMENTS

Before describing one embodiment of the present invention, one disadvantage of a previously proposed phase detector circuit will be described with reference to FIG. 1. A graphical representation of the output of such previously proposed phase detector is illustrated. As noted hereinabove, one problem of a single-balanced type of phase detector resides in the fact that even when no input signal is applied thereto, the phase detector produces an output voltage $e$. If the phase of the input signal is coincident with the phase of, for example, a reference signal, the output voltage produced by the phase detector falls to zero. This output voltage then increases to a maximum $2e$ as the phase difference between the input and reference signals increases. Thus, when the phase difference is 180°, the maximum output voltage $2e$ is produced by the phase detector circuit. As is seen from FIG. 1, the voltage $e$ is produced when the phase difference between the input and reference signals is 90°. Accordingly, since the voltage $e$ also is produced when no input signal is applied thereto, the effective sensitivity of the phase detector circuit is equal to $e$. This, of course, is seen to be one-half of the full sensitivity $2e$.

As a further disadvantage of such single-balanced type of phase detector, a noise signal will be produced in the detector output voltage if a noise signal is present during or adjacent the intermittent time intervals when an input signal is applied to the phase detector.

Figure 1:
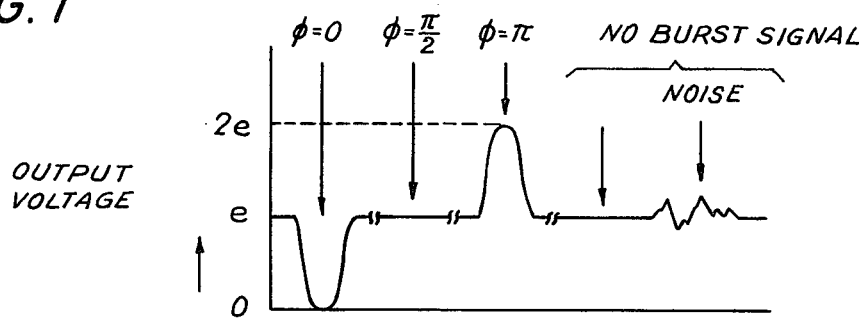
FIG. 1 is a graphical representation of the output derived from a previously proposed phase detector circuit.
Figure 2:
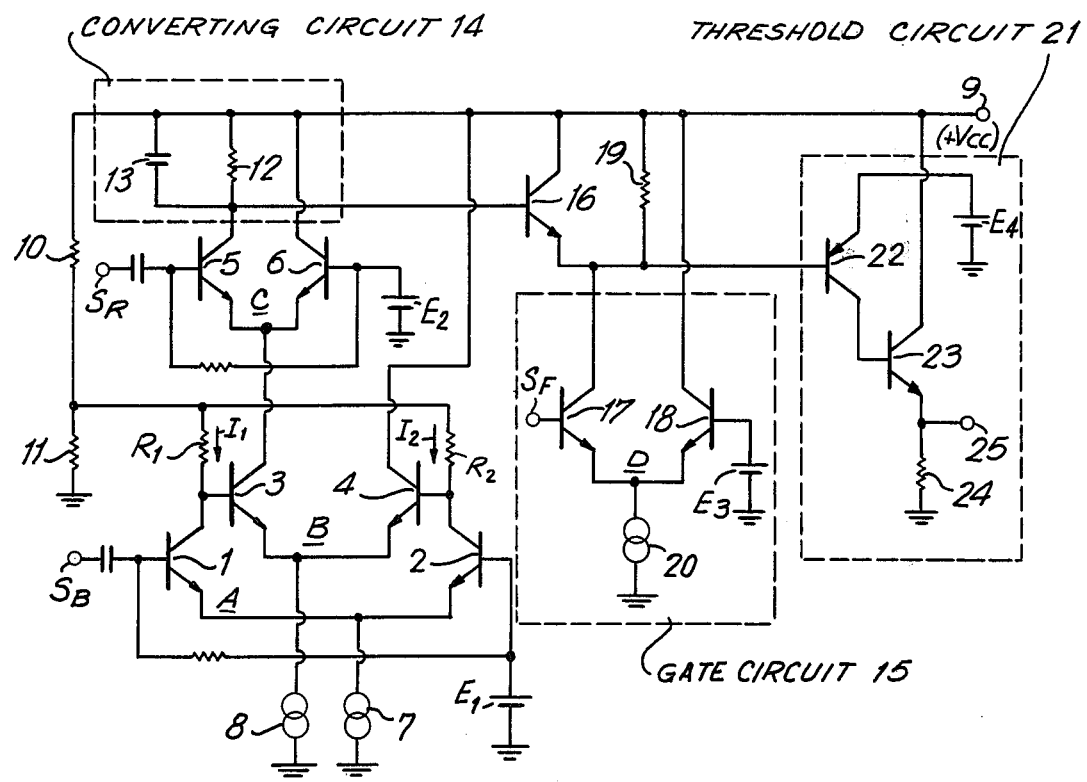
FIG. 2 is a schematic representation of one embodiment of a phase detector in accordance with this invention.

These problems, which are graphically represented by the illustration of FIG. 1, are overcome by the improved phase detector of the present invention which is schematically illustrated in FIG. 2. The improved phase detector is comprised of a first differential amplifier A having an output circuit B and a second differential amplifier C. The differential amplifier A is formed of differentially-connected transistors 1 and 2 having common-connected emitters which are coupled to a reference potential, such as ground, by a current source 7. The base electrodes of the transistors are adapted to receive an input signal differentially applied thereto from an input terminal $S_R$. In addition, bias potentials are applied to the base electrodes of the transistors 1 and 2 by a suitable source of bias potential which here is depicted as a voltage source $E_1$. Of course, any alternative bias circuit may be used to supply the bias potentials to the transistors.

In the example shown in FIG. 2, the output circuit B connected to the differential amplifier A is a further differential amplifier formed of differentially-connected transistors 3 and 4 whose common-connected emitters are coupled to the reference potential by a current source 8. The base electrodes of the transistors 3 and 4 serve as a pair of input terminals to the further differential amplifier and, as shown, are coupled to the collector electrodes of the respective transistors 1 and 2. Thus, the collector electrodes of the transistors forming the differential amplifier A can be thought of as the output terminals of this differential amplifier.

The common-connected collector and base electrodes of the transistors 1 and 3 are coupled through a resistor $R_1$, which may be considered as a load impedance for one stage of the differential amplifier A, to a junction defined by series resistors 10 and 11. The resistors 10 and 11 are connected as a voltage divider to a terminal 9 which is adapted to be supplied with an operating potential $+V_{cc}$. Hence, the junction defined by the resistors 10 and 11 serves as the voltage divider output terminal which also is coupled through a resistor $R_2$ to the common-connected base and collector electrodes of the transistors 4 and 2. The resistor $R_2$ may be considered as the load impedance of the other stage of the differential amplifier A. In the illustrated embodiment, the resistance value of the resistor $R_1$ is selected to be greater than the resistance value of the resistor $R_2$ and, as a numerical example, the resistor $R_1$ may be twice as great as the resistor $R_2$.

The collector electrode of the transistor 4 is connected directly to the source of operating potential applied to the terminal 9 and the collector electrode of the transistor 3 is connected to the diffential amplifier C. More particularly, the differential amplifier C is formed of differentially-connected transistors 5 and 6 having common-connected emitters. The common connection of these emitters is coupled to the collector electrode of the transistor 3. The transistors 5 and 6 are adapted to receive an input signal diffentially applied thereto from an input terminal $S_R$. Bias potentials are applied to the base electrodes of the transistors 5 and 6 by a bias voltage source while, for example, is represented as the source $E_2$. It is appreciated that the bias source $E_2$ may comprise any conventional bias network for supplying suitable bias potentials to the transistors.

The collector electrode of the transistor 6 is connected directly to the source of operating potential applied to the terminal 9. The collector electrode of the transistor 5 is connected through a converting circuit 14 to the terminal 9. The converting circuit is formed of a resistor 12 connected in parallel with a capacitor 13 and, as will soon be described, serves to convert a time duration to a signal level. As is appreciated, the circuit 14 may comprise an integrating circuit, or the like.

The operation of the phase detector circuit, thus far described, now will be explained. As an example of its application, the circuit operation will be explained in the environment of a color television receiver wherein the phase of a received burst signal is compared to the phase of a locally-generated reference signal. Those of ordinary skill in the color television art will recognize that, during color demodulation, the phase of the burst signal is used to control the phase of the reference signal so that the color subcarrier can be produced and used to demodulate the received chrominance signal. Accordingly, for the purpose of this explanation, the input terminal $S_B$ is supplied with the received burst signal and the input terminal $S_R$ is supplied with the locally-generated reference signal. It should be appreciated that the burst signal is comprised of plural cycles of the color subcarrier which are transmitted during portions of the horizontal synchronizing pulse interval. Thus, the burst signal is received during periodic, or intermittent, time intervals. Stated otherwise, the burst signal is comprised of periodic pulses of the color subcarrier.

Let it initially be assumed that the input terminal $S_B$ is not supplied with a burst signal. This may be considered the quiescent condition. Accordingly, the bias voltage source $E_1$ supplies equal bias potentials to the base electrodes of the transistors 1 and 2. Consequently, these transistors are rendered conductive so that current flows through the collector-emitter circuits thereof and through the current source 7. Since equal bias potentials are applied thereto, during the quiescent condition, equal collector currents flow through the transistors comprising the differential amplifier A. However, since the resistor $R_1$ has been assumed to be greater than the resistor $R_2$, it is recognized that the voltage drop across the resistor $R_1$ is greater than the voltage drop across the resistor $R_2$. When the voltage across the resistor $R_1$ is subtracted from the output voltage of the voltage divider circuit formed of the resistors 10 and 11, and when the voltage across the resistor $R_2$ is subtracted from the divider circuit output voltage, it is seen that the base voltage applied to the transistor 3 is less than the base voltage applied to the transistor 4. Hence, the transistor 3 is rendered non-conductive while the transistor 4 conducts.

It is recognized that the transistor 3 may be considered as a current source for the differential amplifier C. Accordingly, if the transistor 3 is non-conductive, current cannot flow thereto and, correspondingly, a differential amplifier current cannot flow through the differential amplifier C. Thus, when the transistor 3 is non-conductive, the transistors 5 and 6 also are non-conductive, regardless of the bias potentials and input signals which may be applied thereto. Since no current flows through the transistor 5, the collector electrode thereof is provided with, essentially, the operating potential $+V_{cc}$. This electrode corresponds to the detector circuit output terminal and, therefore, a voltage having an amplitude $+V_{cc}$ is provided thereat during the quiescent state when no burst signal is applied to the input terminal $S_B$.

Let is now be assumed that an input burst signal is applied to the input terminal $S_B$ so as to be differentially applied to the transistors 1 and 2. During the positive half cycle of the burst signal, e.g., when the burst signal is of positive polarity, the transistor 1 conducts the current $I_1$ therethrough. This current increases as the transistor becomes more conductive in response to the burst signal. At the same time, because of differential operation, the conductivity of the transistor 2 decreases so that the current $I_2$ therethrough correspondingly decreases. It is appreciated that the collector voltage of the transistor 2 thus increases while the collector voltage of the transistor 1 decreases. Consequently, the transistor 3 remains non-conductive while the transistor 4 remains in its conductive state.

Now, during the negative half cycle of the burst signal, e.g., the negative polarity of the burst signal, the current $I_1$ through the transistor 1 is seen to decrease while the current $I_2$ through the transistor 2 increases. As the transistor 1 is made less conductive, its collector voltage increases while the collector voltage of the transistor 2 correspondingly decreases to thereby render the transistor 3 conductive and the transistor 4 non-conductive. Therefore, it is seen that the transistor 3, which acts as a current source for the differential amplifier C, permits a differential amplifier current to flow through the differential amplifier C. Stated otherwise, when the transistor 3 conducts, the differential amplifier C is actuated.

When the differential amplifier C is actuated, the reference signal applied to the input terminal $S_R$ causes the transistors 5 and 6 to alternate their respective conduction in correspondence with the positive and negative half cycles of the reference signal. That is, the reference signal is applied differentially to the differential amplifier C so that, during the positive half cycle of the reference signal, the transistor 5 is rendered conductive and, conversely, during the negative half cycle of the reference signal, the transistor 6 is rendered conductive. Similarly, during the negative half cycle of the reference signal, the transistor 5 is rendered non-conductive.

Thus, it is seen that when the burst signal is in its negative half cycle the differential amplifier C is actuated. Once actuated, if the reference signal is in its negative half cycle, the transistor 5 is non-conductive; but if the reference signal is in its positive half cycle, the transistor 5 conducts. Stated otherwise, when both the burst and reference signals are in their respective negative half cycles, i.e., when they are in phase, no current flows through the transistor 5 and an output voltage amplitude $+V_{cc}$ is produced at the phase detector output terminal. However, if, while the burst signal is in its negative half cycle, the reference signal now exhibits its positive half cycle, the transistor 5 is conductive to thus decrease the voltage at its collector electrode. Accordingly, when the burst and reference signals are out-of-phase, the voltage amplitude at the phase detector output terminal is reduced. It is appreciated that the transistor 5 is conductive for a maximum duration when the burst and reference signals are 180° out-of-phase. Accordingly, it is appreciated that, as the phase difference between the burst and reference signals varies from 0° to 180°, the time interval during which the transistor 5 is conductive varies from zero to a full half cycle of the reference signal.

Figure 3:
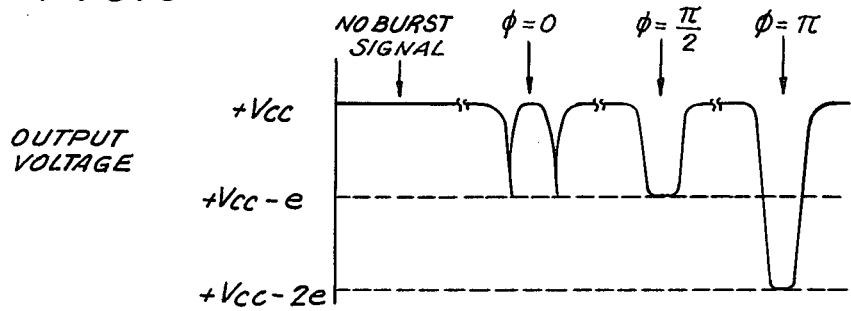
FIG. 3 is a graphical representation of the output signal derived from the phase detector depicted in FIG. 2.

From the foregoing, it is appreciated that the collector voltage of the transistor 5 is, essentially, a time-related output which, for example, is a pulse width modulated signal having a pulse width which is a function of the phase differential between the respective input signals. The circuit 14 has a suitable time constant to convert this pulse width modulated signal to a voltage amplitude which is directly proportional to the pulse width. Thus, the output of the circuit 14 varies from a maximum $+V_{cc}$ when the transistor 5 is non-conductive, i.e., when the burst signal is in phase with the reference signal, to a minimum $+V_{cc}-2e$ when the transistor 5 is conductive for a full half cycle, i.e., when the burst signal is 180° out-of-phase with the reference signal. For a phase difference of 90°, the output of the circuit 14 is substantially equal to $+V_{cc}$-e. A grapical representation of the output of this phase detector is shown in FIG. 3. Since the output of the phase detector is equal to $+V_{cc}$ when no burst signal is applied to the differential amplifier A, it is readily apparent that the sensitivity of this phase detector circuit is twice as great as the sensitivity of the phase detector associated with the FIG. 1 characteristics.

The phase detector circuit shown in FIG. 2 exhibits favorable noise rejection characteristics. Even if noise is superposed on the received burst signal, the phase detector output will not be provided with such noise. This is because the transistor 3 cannot be rendered conductive until the amplitude of the burst signal is relatively high. Consequently, the conductivity of the transistor 3 is not easily affected by the relatively lower amplitude noise signal.

As a further advantage, since the burst signal is amplified by two stages of differential amplification, that is, by the differential amplifiers A and B, such amplification has the effect of a limiter. Thus, the burst signal is maintained at a relatively constant amplitude level so that the current flowing through the transistor 3, when this transistor is conductive, likewise is maintained at a relatively constant level. Thus, before the width-to-amplitude conversion produced by the circuit 14, it is recognized that the collector voltage of the transistor 5 exhibits approximately the same level whenever the transistor is rendered conductive, but the period of conductivity is directly related to the phase difference between the reference and burst signals. The use of the two differential amplifiers A and B avoids deleterious effects that may be attributed to amplitude modulations which would otherwise be occasioned in the absence of the aforenoted limiter effects.

In a practical application of the illustrated phase detector circuit, the burst signal applied to the input terminal $S_B$ might be accompanied by errors at the beginning and ending portions thereof. Such errors have been attributed to phase fluctuations adjacent the leading and trailing edges of the burst pulse. Accordingly, it is preferable to carry out the phase detection process during a time interval less than the full burst pulse width so as to avoid deleterious effects upon the phase detector output signal due to the aforenoted errors at the beginning and ending portions of the burst pulse. This can be readily accomplished by connecting the phase detector output terminal through a gate circuit to a signal output terminal. If the gate circuit is maintained in a de-energized, or closed, condition, except during the desired portion of the burst interval, the effect is that the signal output terminal will not be provided with a phase detector output signal at any time other than the desired time interval.

Accordingly, and as is shown in FIG. 2, a gate circuit 15 is interposed between the phase detector output terminal, i.e., the collector electrode of the transistor 5, and a signal output terminal 25. The gate circuit 15 is adapted to be energized, or opened, during a predetermined sampling interval established by a sampling pulse applied to a gate input terminal $S_F$. In particular, the gate circuit is formed of transistors 17 and 18 having common-connected emitters coupled to the reference potential by a current source 20. The base electrode of the transistor 17 is connected to the terminal $S_F$ and is adapted to receive a gating signal, such as a burstflag pulse. The base electrode of the transistor 18 is coupled to a bias voltage source represented as a voltage source $E_3$ and is adapted to receive a bias potential. As is appreciated, any suitable bias voltage circuit capable of generating appropriate bias potentials can be used.

The collector electrode of the transistor 18 is connected to the terminal 9 whereat the operating potential $+V_{cc}$ is provided. The collector electrode of the transistor 17 is connected to the emitter of a buffer transistor 16, the base electrode of the buffer transistor being connected to the output terminal of the phase detector circuit. It will be apparent that the phase detector output, which is applied to the base electrode of the buffer transistor 16, cannot be transmitted by the buffer transistor to the signal output terminal 25 unless the transistor 17 is conducting. It will be further appreciated that the transistor 17 is not conductive unless the burst-flag pulse applied thereto exceeds the bias potential applied to the transistor 18 by the bias voltage source $E_3$.

In operation, the burst-flag pulse has a width which is greater than the width of the burst signal interval. However, the burst-flag pulse generally is trapezoidal in shape. Consequently, as the voltage of the leading edge of the burst-flag pulse increases, the leading edge will exceed the bias potential $E_3$ at a point in time which follows the beginning portion of the burst pulse. Similarly, the trailing edge of the burst-flag pulse exhibits a decreasing voltage level which falls below the bias potential $E_3$ at a point in time which precedes the ending portion of the burst pulse. Thus, the transistor 17 is rendered conductive only during the sampled central portion of the burst pulse. This, of course, means that the transistor 16 is conductive only during those periods of conduction of the transistor 17, i.e., only during the sampled central portion of the burst plate. Thus, the output of the phase detector circuit is transmitted through the buffer transistor 16 toward the signal output terminal 25 during the sampled central portion of the burst pulse so that errors which might be present during the beginning and ending portions of the burst signal are prevented from being transmitted through to the signal output terminal 25.

Although the emitter electrode of the buffer transistor 16 may be coupled directly to the signal output terminal 25, in the embodiment illustrated in FIG. 2 a threshold circuit 21 is interposed between the buffer transistor and the signal output terminal. The purpose of this threshold circuit is to permit the output of the phase detector circuit to be transmitted to the signal output terminal only when the phase difference between the burst and reference signals is greater than a predetermined, threshold value. Accordingly, the threshold circuit is comprised of complementary transistors 22 and 23, with the transistor 22 being a PNP-type having its emitter electrode coupled to a bias voltage supply $E_4$, its base electrode connected to the emitter of the buffer transistor 16 and its collector electrode connected to the base electrode of the transistor 23. As is seen, the transistor 23 is disposed in emitter-follower configuration.

When operated, the transistor 22 cannot be rendered conductive unless its base voltage is less than its emitter voltage. That is, when the voltage produced by the circuit 14 and representing the phase difference between the burst and reference signals is supplied by the buffer transistor 16 to the transistor 22, the transistor 22 is not conductive unless this supplied voltage is less than the bias voltage derived from the bias source $E_4$.

Hence, as is seen from FIG. 3, when the phase differential between the input signals is greater by a predetermined amount than 0°, the transistor 22 is supplied with a voltage which now is less than the bias voltage applied to its emitter electrode to thereby permit the phase detector output, which is gated through the buffer transistor 16 by the gate circuit 15, to be supplied through the emitter-follower transistor 23 to the signal output terminal 25. In this matter, the signal output terminal 25 is provided with the phase detector output in the absence of noise and in the absence of deleterious error signals, to thereby permit the desired utilization of the phase detector output.

Figure 4:
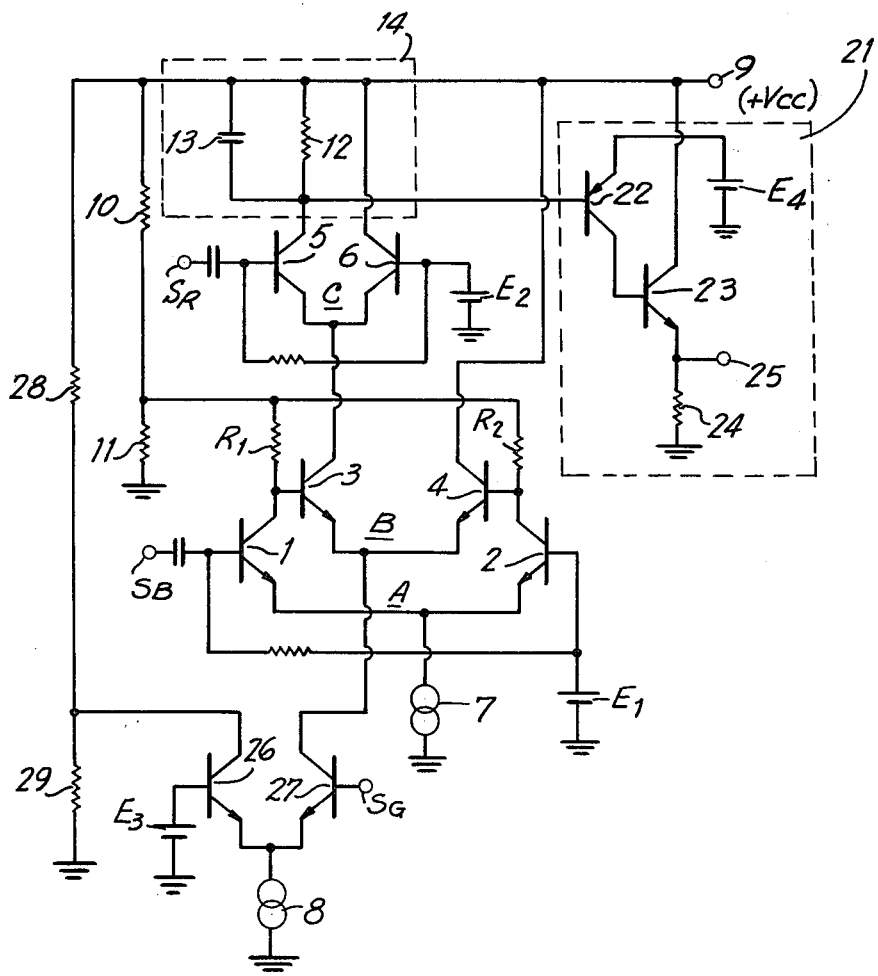
FIG. 4 is a schematic diagram of another embodiment of the present invention.

Another embodiment of this invention is depicted in FIG. 4. This embodiment is substantially similar to the aforedescribed embodiment of FIG. 2 with the following exceptions:

In FIG. 4, the buffer transistor 16 is omitted and the output of the circuit 14 is connected directly to the threshold circuit 21. Also, in this embodiment, the gate circuit 15 has been replaced by an enabling circuit which is coupled to the differential amplifier B and which serves substantially the same purpose as the aforedescribed gate circuit. That is, the enabling circuit shown in FIG. 4 serves to prevent the phase detector from effectively operating on the respective input signals other than during a sampled central portion of the burst pulse.

As is shown, the enabling circuit is comprised of a differential amplifier formed of transistor 26–27 having common-connected emitters which are coupled to the reference potential by the current source 8. The base electrode of the transistor 26 is supplied with a bias potential derived from the bias voltage source $E_3$. The collector electrode of the transistor 26 is connected to a voltage divider circuit which extends between the terminal 9 and ground and is formed of the series-connected resistors 28 and 29. If desired, the collector electrode of the transistor 26 may be coupled directly to the terminal 9, as through a load resistor, or the like.

The collector electrode of the transistor 27 is coupled to the common-connected emitters of the transistors 3 and 4 of the differential amplifier B. The base electrode of the transistor 27 is connected to a gating signal input terminal $S_G$ and is adapted to receive a gate signal which, for example, may be a rectangular pulse whose width is equal to the desired sampled duration and, thus, may be narrower than the aforedescribed burst-flag signal. If desired, the transistor 26 may be omitted.

As is recognized, the transistor 3 cannot be rendered conductive until the transistor 27 is conducting. Hence, regardless of the amplitude, polarity and phase of the burst signal applied to the input terminal $S_B$, the collector voltage of the transistor 1 cannot turn the transistor 3 ON until the gate signal applied to the gate signal input terminal $S_G$ turns the transistor 27 ON. When this occurs, current is permitted to flow through the transistor 27 to thereby actuate the differential amplifier B so that the transistor 3 may be rendered conductive during those intervals described hereinabove with respect to FIG. 2.

The remainder of the circuit illustrated in FIG. 4 operates in the same manner as that described above with respect to the embodiment of the phase detector illustrated in FIG. 2. Therefore, in the interest of brevity, further description of the phase detector circuit is not provided.

While the present invention has been particularly shown and described with reference to typical embodiments thereof, it should be readily appreciated that various modifications in form and details may be made without departing from the spirit and scope of the invention. For example, although the resistor $R_1$ has been described as being greater than the resistor $R_2$, it is appreciated that these resistors may, in alternative embodiments, be of equal resistance; or, as a further alternative, the resistor $R_2$ may be greater than the resistor $R_1$. As a further modification of the illustrated phase detector circuits, it is appreciated that the transistors 3 and 4 may be interchanged such that the collector of the transistor 4 is connected to the differential amplifier C, whereas the collector of the transistor 3 is supplied with the operating potential. As yet another modification, it is recognized that the output of the phase detector circuit may, for example, increase from a lower level when no burst, or input, signal is applied, or when the phase differential of the input signals is 0°, to a higher level as the phase differential increases. In yet another modification, various complementary transistors may be substituted for the transistors depicted in FIGS. 2 and 4, with a corresponding change in the polarity of bias and information signals applied thereto. Therefore, it is intended that the appended claims be interpreted as including the foregoing as well as other changes in form and details.

What is claimed is:
1. A phase detector for producing an output signal representing the difference between the phase of a first signal and the phase of a second signal, comprising:
 a first differential amplifier having a pair of differentially-connected stages including input terminals for receiving said first signal differentially applied thereto, and output terminals;
 a second differential amplifier having a pair of differentially-connected stages including input terminals respectively connected to said first differential amplifier output terminals, and output terminals; and
 a third differential amplifier having a pair of common-connected differential stages, the common connection being coupled to one of said second differential amplifier stages, said differentially-connected stages of said third differential amplifier including input terminals for receiving said second signal differentially applied thereto, and output terminals for producing said output signal proportional to the phase difference between the output of said second differential amplifier and said second signal.

2. A phase detector in accordance with claim 1 wherein said differentially-connected stages of said first differential amplifier include respective resistive load impedances of different resistance values.

3. A phase detector in accordance with claim 2 wherein said third differential amplifier produces a time-related output which is a function of the difference in phase between the second differential amplifier output applied to the common-connected differential stages of said third differential amplifier and said second signal, and further comprising means coupled to one of said third differential amplifier output terminals for converting said time-related output to a signal having an amplitude proportional to the difference between the phase of said first and second signals.

4. A phase detector in accordance with claim 1 wherein one stage of said first differential amplifier is connected to a load impedance having a greater value than the load impedance to which the other stage of said first differential amplifier is connected; the output terminal of said one stage of said first differential amplifier being connected to the input terminal of the one stage of said second differential amplifier whose output terminal is coupled in common to the common-connected differential stages of said third differential amplifier.

5. A phase detector in accordance with claim 1 further comprising a signal output terminal; and means for selectively enabling the output signal produced by said third differential amplifier to be applied to said signal output terminal.

6. A phase detector in accordance with claim 5 wherein said selective enabling means comprises gating means having a first input for receiving said third differential amplifier output signal; a second input for receiving a predetermined gating signal; and an output for producing said output signal only when said predetermined gating signal is present.

7. A phase detector in accordance with claim 5 wherein said selective enabling means comprises actuating means coupled to said second differential amplifier for selectively actuating said second differential amplifier to apply the output thereof to said common-connected differential stages of said third differential amplifier when a predetermined signal is applied to said actuating means.

8. A phase detector in accordance with claim 7 wherein said actuating means comprises switch means for selectively supplying said second differential amplifier with a differential amplifier current.

9. A phase detector in accordance with claim 1 wherein said output signal produced by said third differential amplifier varies in a given direction from a first level when said phase difference is zero to a second level when said phase difference is 180°, and further comprising threshold means for enabling said output signal to be transmitted to a signal output terminal when said phase difference exceeds a predetermined threshold level.

* * * * *